(12) United States Patent
Guo

(10) Patent No.: US 11,257,984 B2
(45) Date of Patent: Feb. 22, 2022

(54) III-NITRIDE DOWN-CONVERSION NANOMATERIAL FOR WHITE LEDS

(71) Applicant: University of Massachusetts, Boston, MA (US)

(72) Inventor: Wei Guo, Lowell, MA (US)

(73) Assignee: UNIVERSITY OF MASSACHUSETTS, Boston, MA (US)

( * ) Notice: Subject to any disclaimer, the term of this patent is extended or adjusted under 35 U.S.C. 154(b) by 34 days.

(21) Appl. No.: 16/619,808

(22) PCT Filed: Jun. 8, 2018

(86) PCT No.: PCT/US2018/036642
§ 371 (c)(1),
(2) Date: Dec. 5, 2019

(87) PCT Pub. No.: WO2018/227074
PCT Pub. Date: Dec. 13, 2018

(65) Prior Publication Data
US 2020/0135974 A1 Apr. 30, 2020

Related U.S. Application Data

(60) Provisional application No. 62/517,221, filed on Jun. 9, 2017.

(51) Int. Cl.
*H01L 33/50* (2010.01)
*H01L 33/32* (2010.01)
(Continued)

(52) U.S. Cl.
CPC .......... *H01L 33/32* (2013.01); *H01L 33/0095* (2013.01); *H01L 33/06* (2013.01); *H01L 33/502* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2005/0064185 A1 | 3/2005 | Buretea et al. | |
| 2008/0185604 A1* | 8/2008 | Kim | C09K 11/54 257/98 |
| 2010/0295464 A1 | 11/2010 | Kasakura et al. | |

OTHER PUBLICATIONS

Kuykendall et al., "Complete composition tunability of InGaN nanowires using a combinatorial approach", Nature Materials, Nature Materials, 6, 951-956, p. 951, col. 12; p. 952, col. 2—p. 953 col. 1-2, 2007.

(Continued)

*Primary Examiner* — Bradley Smith
(74) *Attorney, Agent, or Firm* — Brake Hughes Bellermann LLP

(57) ABSTRACT

A phosphor component that includes a plurality of nanowires absorbing light at one wavelength and emitting light at a longer wavelength, the longer wavelength being from about 495 nm to about 780 nm, each one of the plurality of nanowires being one of a nanowire described by a composition formula of InxGa1-$_x$N, $x$ being between about 0.1 to about 0.6 or a GaN nanowire having In$_x$Ga1-$_x$N discs in a nanowire structure, x being between about 0.1 to about 0.8 and a light emitting device using the phosphor component are disclosed.

16 Claims, 11 Drawing Sheets

(51) Int. Cl.
*H01L 33/00* (2010.01)
*H01L 33/06* (2010.01)

(56) References Cited

OTHER PUBLICATIONS

Chao Zhao et al., Direct Growth of High-Power InGaN/GaN Quantum-Disks-in-Nanowires Red Light-Emitting Diodes on Polycrystalline Molybdenum Substrates, CLEO:2016 © OSA 2016.
Blandine Alloing, Jesús Zúñiga-Pérez, Metalorganic chemical vapor deposition of GaN nanowires: From catalyst-assisted to catalyst-free growth, and from self-assembled to selective-area growth, Materials Science in Semiconductor Processing 55, 51-58, 2016.

* cited by examiner

III-NITRIDE DOWN-CONVERSION NANOMATERIAL FOR WHITE LEDS

CROSS-REFERENCE TO RELATED APPLICATIONS

This application is a U.S. national stage application under 35 U.S.C. 371 of co-pending International Application No. PCT/US2018/036642, filed on Jun. 8, 2018, entitled III-NITRIDE DOWN-CONVERSION NANOMATERIAL FOR WHITE LEDS, which in turn claims priority to and benefit of Provisional Application No. 62/517,221, filed Jun. 9, 2017, which are incorporated by reference herein in their entirety for all purposes.

BACKGROUND

These teachings relate generally to phosphor components for LEDs, and, more particularly, to nanowires as phosphor components for LEDs.

In solid state lighting, the white emission is created by combining emissions from down-converter materials with InGaN quantum well based blue LEDs. In first generation LEDs, inorganic phosphors, commonly YAG:Ce phosphor, are largely utilized as the down-converter materials. In this method, it is difficult to achieve a tailored-spectrum white light with available phosphors and the conversion efficiency is also by and large limited. FIG. 1 illustrates the emission spectra of commercial phosphor based cool (red) and warm (blue) white LEDs. It is found that the emission spectrum is hardly tunable and, in particular, the conversion efficiency for warm white LEDs is reduced due to the energy loss at the wavelength above 650 nm. The semiconductor nanomaterial down-converter materials are advantageous in high emission quantum yields, spectral purity, long-term photo- and thermal-stability and processability (compatible integration) compared to the traditional phosphor materials. In this context, there is large driving-force to develop the alternative phosphor materials, where semiconductor nanomaterials, such as quantum dot nanocrystal, have been considered as promising candidates. Samsung has recently launched their QLED TVs to provide sharper contrast and images compared to traditional LED and OLED TVs, where, in the QLED TVs, the display panel back light is made of QD white LEDs with colloidal QD as the down-converter materials. However, the colloidal QD phosphor materials are generally suffering from a variety of non-radiative loss mechanisms, short lifetime and containing toxic materials.

There is a need other phosphor components for LEDs.

BRIEF SUMMARY

Nanowires used as phosphor components for LEDs are disclosed herein below.

In one or more embodiments, the phosphor component of these teachings includes a plurality of nanowires absorbing light at one wavelength and emitting light at a longer wavelength, the longer wavelength being from about 495 nm to about 780 nm, each one of the plurality of nanowires each one of the plurality of nanowires being one of a nanowire described by a composition formula of $In_xGa_{1-x}N$, x being between about 0.1 to about 0.8 or a GaN nanowire having $In_xGa_{1-x}N$ discs in the nanowire structure, x being between about 0.1 to about 0.8.

In one or more embodiments, the light emitting device of these teachings includes the phosphor component of these teachings and a light source emitting light at a wavelength of less than 495 nm.

In one or more embodiments, the method of these teachings for making a phosphor component includes depositing a plurality of nanowires absorbing light at one wavelength and emitting light at a longer wavelength on a substrate, the longer wavelength being from about 495 nm to about 700 nm; each one of the plurality of nanowires being one of a nanowire described by a composition formula of $In_xGa_{1-x}N$, x being between about 0.1 to about 0.8 or a GaN nanowire having $In_xGa_{1-x}N$ discs in the nanowire structure, x being between about 0.1 to about 0.8.

In one instance, the method also includes separating each nanowire from the plurality of nanowires source such that said each nanowire from the plurality of nanowires is not on a common substrate with another nanowire from the plurality of nanowires.

Other embodiments are also disclosed.

For a better understanding of the present teachings, together with other and further objects thereof, reference is made to the accompanying drawings and detailed description and its scope will be pointed out in the appended claims.

DETAILED DESCRIPTION

The following detailed description presents the currently contemplated modes of carrying out the invention. The description is not to be taken in a limiting sense, but is made merely for the purpose of illustrating the general principles of the invention, since the scope of the invention is best defined by the appended claims.

As used herein, the singular forms "a," "an," and "the" include the plural reference unless the context clearly dictates otherwise.

Nanowires used as phosphor components for LEDs are disclosed herein below.

In one or more embodiments, the phosphor component of these teachings includes a plurality of nanowires absorbing light at one wavelength and emitting light at a longer wavelength, the longer wavelength being from about 495 nm to about 780 nm, each one of the plurality of nanowires each one of the plurality of nanowires being one of a nanowire described by a composition formula of $In_xGa_{1-x}N$, x being between about 0.1 to about 0.8 or a GaN nanowire having $In_xGa_{1-x}N$ discs in the nanowire structure, x being between about 0.1 to about 0.8.

Figure 1:
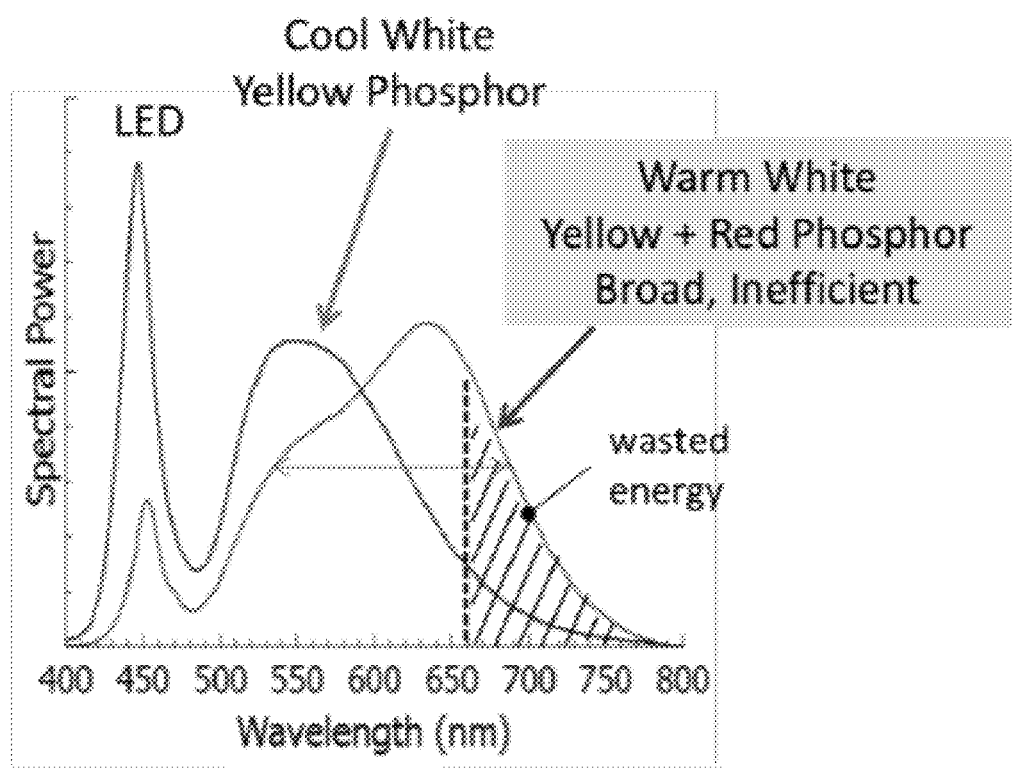
FIG. 1 shows the emission spectra of commercial cool (blue) and warm (red) white LEDs.
Figure 2:
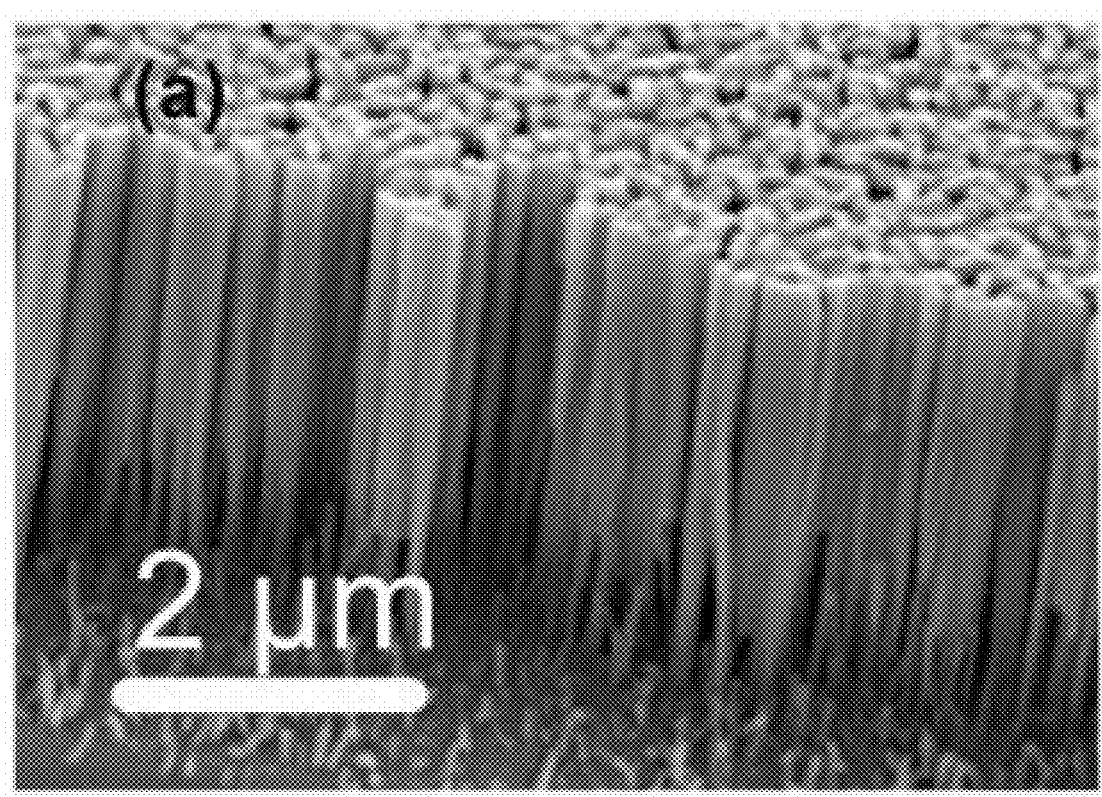
FIG. 2 shows an SEM image of InGaN nanowires grown on silicon substrates.

In one instance, (In)GaN nanowires have been grown on (001) Si substrates in a plasma-assisted molecular beam epitaxy (PA-MBE) system (see Wei Guo, Meng Zhang, Animesh Banerjee, and Pallab Bhattacharya, Catalyst-Free InGaN/GaN Nanowire Light Emitting Diodes Grown on (001) Silicon by Molecular Beam Epitaxy, Nano Lett. 2010, 10, 3355-3359, which is incorporated by reference herein in its entirety and for all purposes). An SEM image of InGaN nanowires grown on silicon substrates is shown on FIG. 2 (from Wei Guo, Meng Zhang, Animesh Banerjee, and Pallab Bhattacharya, Catalyst-Free InGaN/GaN Nanowire Light Emitting Diodes Grown on (001) Silicon by Molecular Beam Epitaxy, Nano Lett. 2010, 10, 3355-3359).

Figure 3:
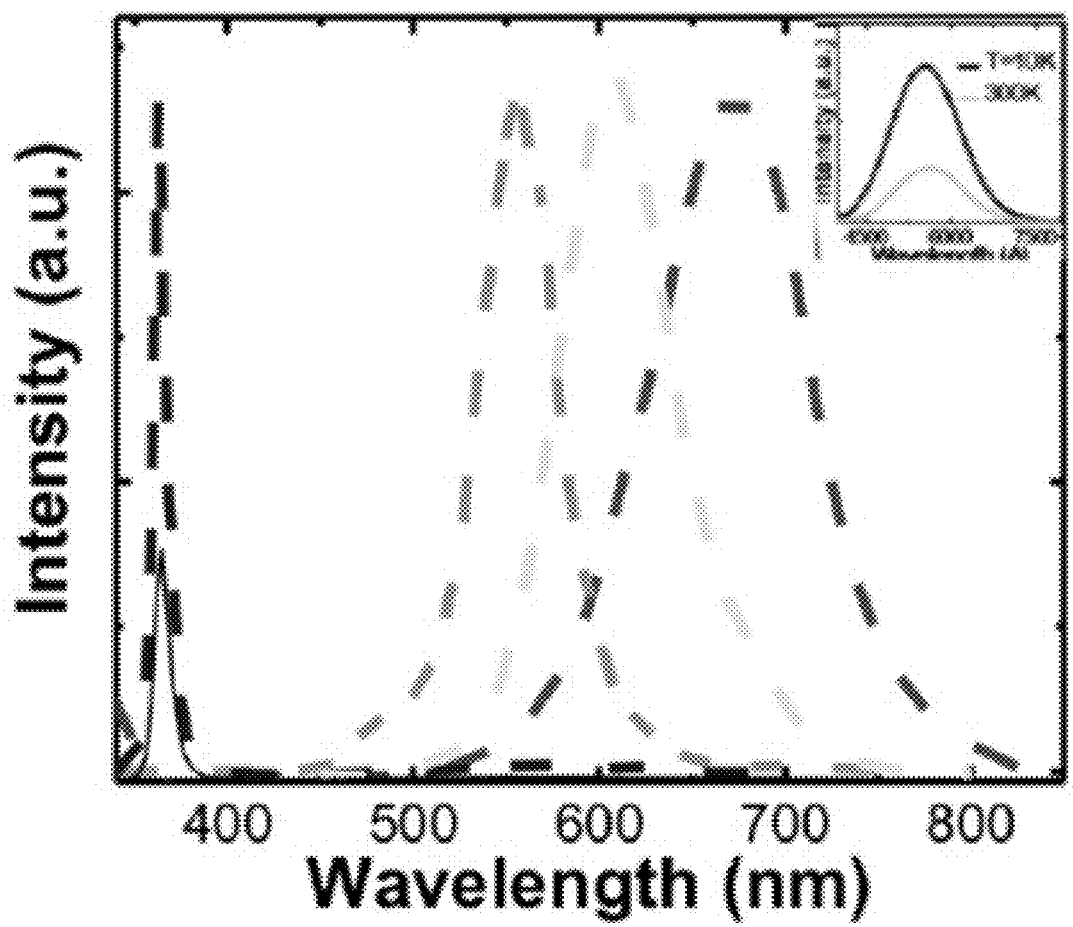
FIG. 3 show Room temperature PL spectra of InGaN nanowires with different In compositions; inset: PL spectra of white InGaN nanowires at 10K and 300K.

In another instance, the (In)GaN nanowires have been catalyst-free grown directly on (001) and (111) silicon substrates. A few monolayers of gallium were first deposited at 800° C. onto the substrate in the absence of N2 plasma. The InGaN and GaN nanowires were grown under N2 rich conditions. To achieve different emission wavelengths, InGaN nanowires with varied indium compositions were synthesized. In order to achieve different indium composition, the growth temperature and indium beam equivalent flux (BEF) were varied from 500° C. to 550° C. and 5e-8 Torr and 3e-7 Torr, respectively. The optical properties of the (In)GaN nanowires were investigated by temperature-dependent photoluminescence (PL) and time-resolved photoluminescence (TRPL) measurements. FIG. 3 shows room temperature PL spectra from InGaN nanowire ensembles having different indium contents. It is noticed that a large tunability of the output spectrum can be obtained by varying the In content in the nanowires. It is also important to note that no defect-related yellow band is observed in the emission spectra, which is the further evidence of the good crystalline quality of the nanowires. As shown in the inset of FIG. 3, an internal quantum efficiency (IQE) of 30% is derived, assuming that the IQE is 100% at 10K.

In yet another instance, (In)GaN nanowires have been grown by low temperature halide chemical vapor deposition (See Complete composition tunability of InGaN nanowires using a combinatorial approach, Nature Materials 6, 951-956, which is incorporated by reference herein in its entirety and for all purposes). In other instances, (In)GaN nanowires are grown by metal-Organic Chemical Vapor Deposition.

In one embodiment, the In composition was continuously varied along the length of the nanowires to provide a broad luminescence spectrum.

In one embodiment, FIG. 3 shows the photoluminescence (PL) spectra of InGaN nanowires with varied indium compositions. In one embodiment, the plurality of nanowires includes a first plurality of nanowires having a value of x, where composition is described by $In_xGa_{1-x}N$, from about 0.1 to about 0.5, and a second plurality of nanowires having the value of x from about 0.5 to about 0.7 or, preferably, from about 0.5 to about 0.6. In one instance, by varying the Indium composition, a number of nanowires having a photoluminescence spectra must be one of the principal colors (such as x from about 0.1 to about 0.5, or, preferably, 0.3 to 0.5 for green and yellow green) and another number of nanowires having a photoluminescence spectrum at another one of the principal colors (such as x from about 0.5 to about 0.7 or, preferably, from about 0.5 to about 0.6 for yellow red to red) can be obtained.

Figure 7A:
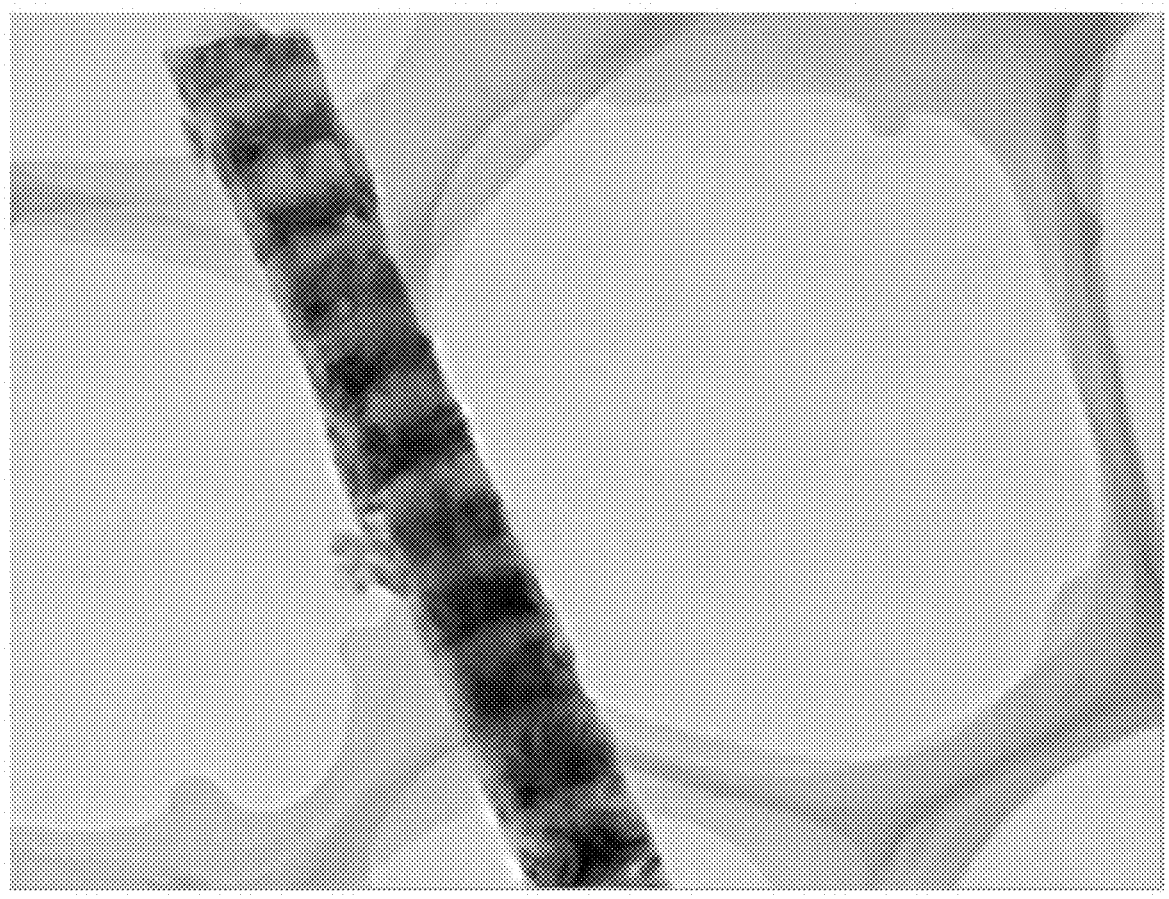
FIG. 7a shows TEM image of the disk in nanowire structures.
Figure 7B:
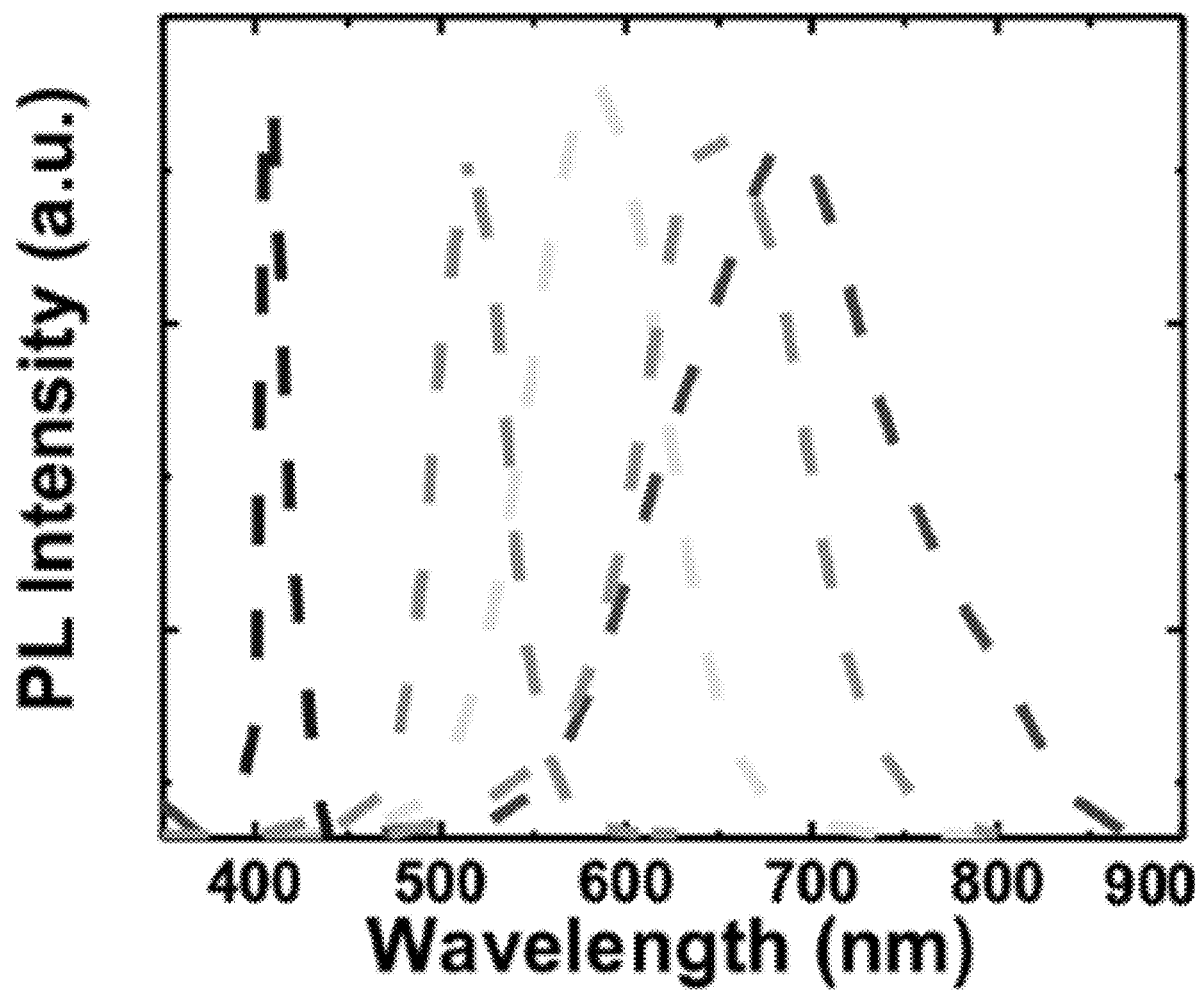
FIG. 7b shows room temperature PL spectra of InGaN disk in nanowires with different In compositions.

In a further instance, InGaN and GaN layers were grown alternatively to form InGaN/GaN quantum disks in GaN nanowires. Quantum disks have been formed by introducing In flux without any growth interruption. (See, for example, L. Rigutti et al., Ultraviolet Photodetector Based on GaN/AlN Quantum Disks in a Single Nanowire, Nano Lett. 2010, 10, 2939-2943, or Chao Zhao et al., Facile Formation of High-Quality InGaN/GaN Quantum-Disks-in-Nanowires on Bulk-Metal Substrates for High-Power Light-Emitters, Nano Lett. 2016, 16, 1056-1063, which are incorporated by reference herein in its entirety and for all purposes.) The TEM image of FIG. 7a shows a GaN nanowire with disk-in-nanowire heterostructure where multiple layers of InGaN disks of 2 nm thickness are self-aligned along the nanowire growth direction. FIG. 7b shows the PL emission spectra different indium compositions and a large tunability of the output spectrum can be obtained as well in the quantum disks in nanowire structures. The tunability is obtained by changing the growth temperature and indium flux resulting in a mixture of different quantum disks with different In composition or different thickness of the disc. The IQE of 40% is also measured from the temperature dependent PL characterizations.

In one embodiment, each nanowire from the plurality of nanowires is not on a common substrate with another nanowire from the plurality of nanowires. The nanowires can be separated from the substrate by several methods—razor blade cutting or ultrasonic certification or using sacrificial layers in the substrate and removing the sacrificial layers. In one instance, the nanowires are dispersed in a binder. When dispersing in a binder, the binding agent in the dispersion can include at least one of a polymer or oligomer binding agent (see, for example, US Patent Application Publication no. 20080017071, entitled Aqueous Binder Dispersion Comprising Nanoparticles, Method for the Production Thereof, And Use Thereof, which is incorporated by reference here in in its entirety and for all purposes).

The phosphor component of these teachings can be combined with a light source emitting at a wavelength less than 495 nm in order to constitute a light emitting device. Embodiments where the value of x (in the formula $In_xGa_{1-x}N$) is varied continuously along the length of each of the nanowires or where the nanowires include the first number of nanowires having a value of x, where composition is described by $In_xGa_{1-x}N$, from about 0.1 to about 0.5, and a second number of nanowires having the value of x from about 0.5 to about 0.7 or, preferably, from about 0.5 to about 0.6, can be used with the light source emitting at a wavelength less than 495 nm to obtain a light emitting device that emits over the entire visible spectrum, usually referred to as a white light emitting device.

Figure 4:
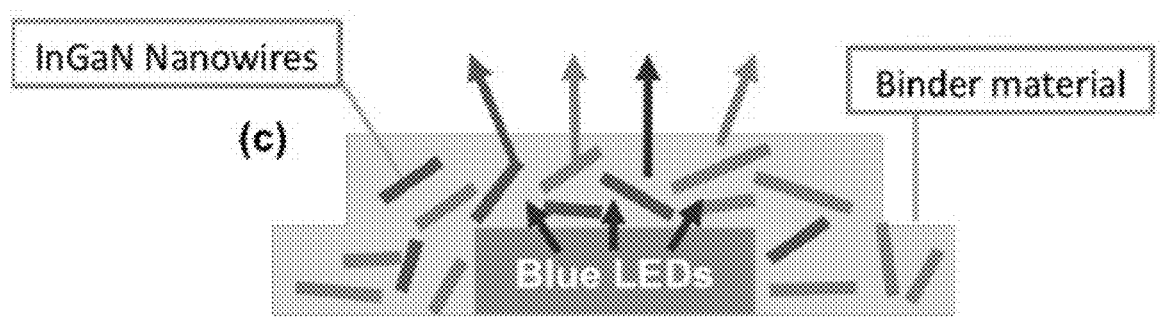
FIG. 4 shows one embodiment of the light emitting device of these teachings.

FIG. 4 shows one embodiment of the light emitting device of these teachings in which each nanowire is disposed in a binder; wherein said each nanowire disposed in a binder is disposed to receive light emanated from the light source.

Figure 5:
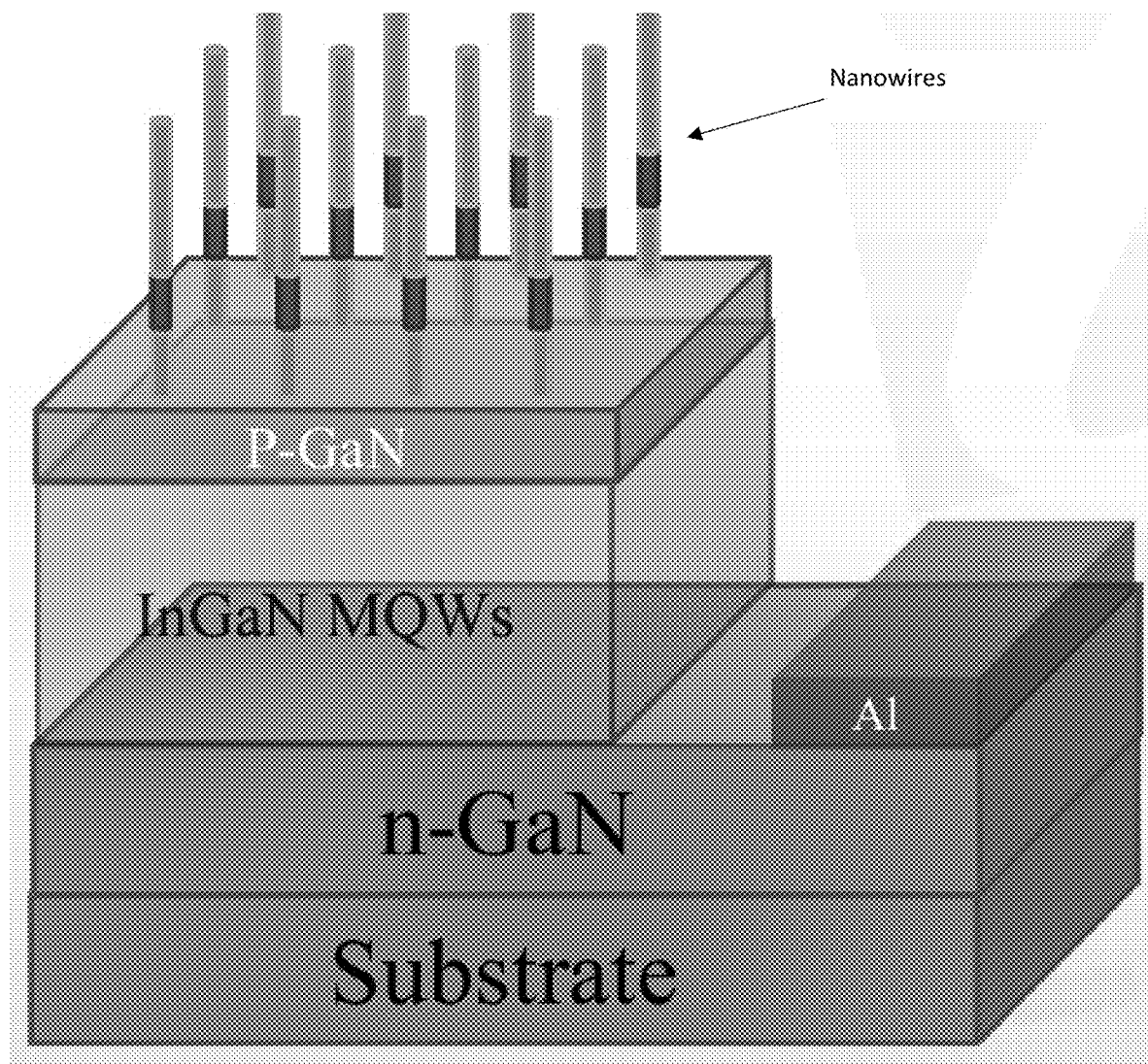
FIG. 5 shows another embodiment of the light emitting device of these teachings.

In another embodiment, each nanowire is disposed on a light emitting structure, the light emitting structure emitting light at a wavelength of less than 495 nm. FIG. 5 shows another embodiment of the light emitting device of these teachings in which each nanowire is disposed on a light emitting structure. The nanowires can be disposed on the light emitting structure by a number of different methods—the nanowires can be disposed on the substructure configured to hold the nanowires in place or the nanowires can be deposited on the light emitting structure.

Figure 9:
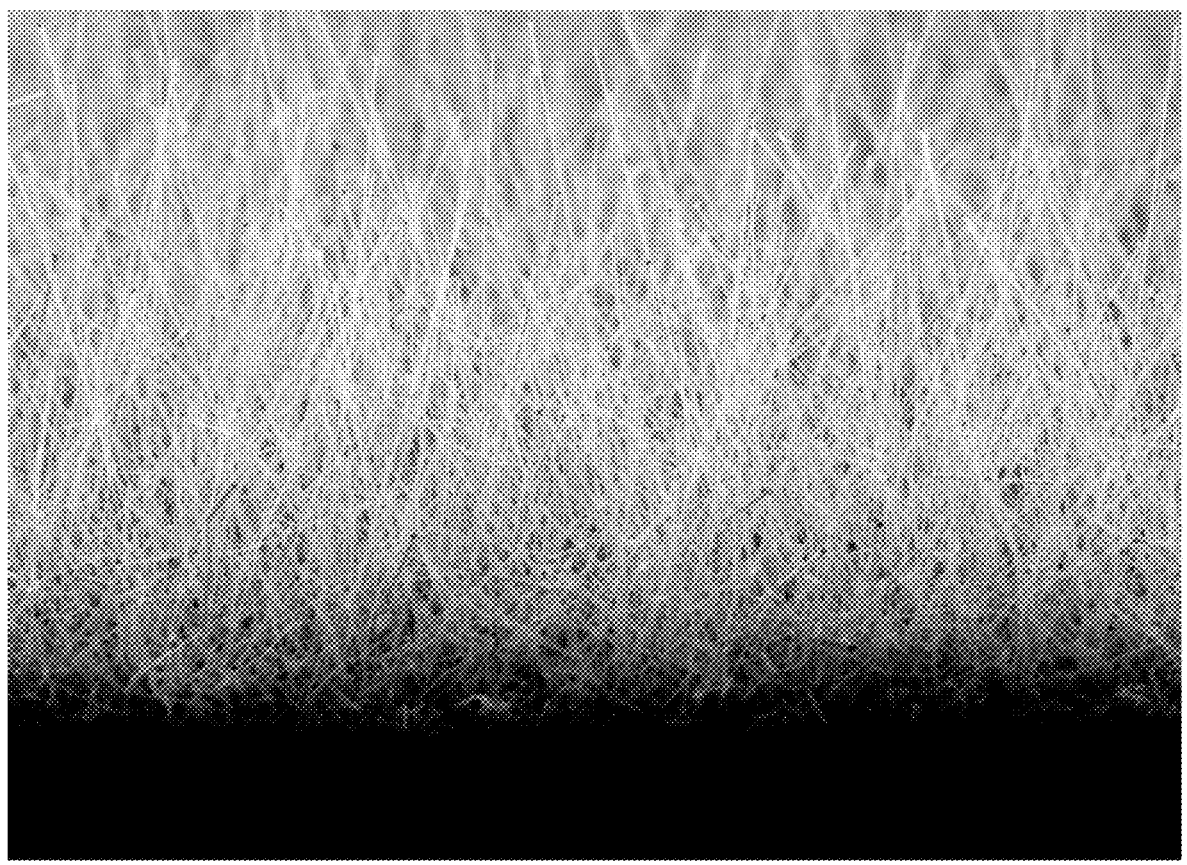
FIG. 9 shows an SEM image of InGaN nanowires grown on an LED.
Figure 10:
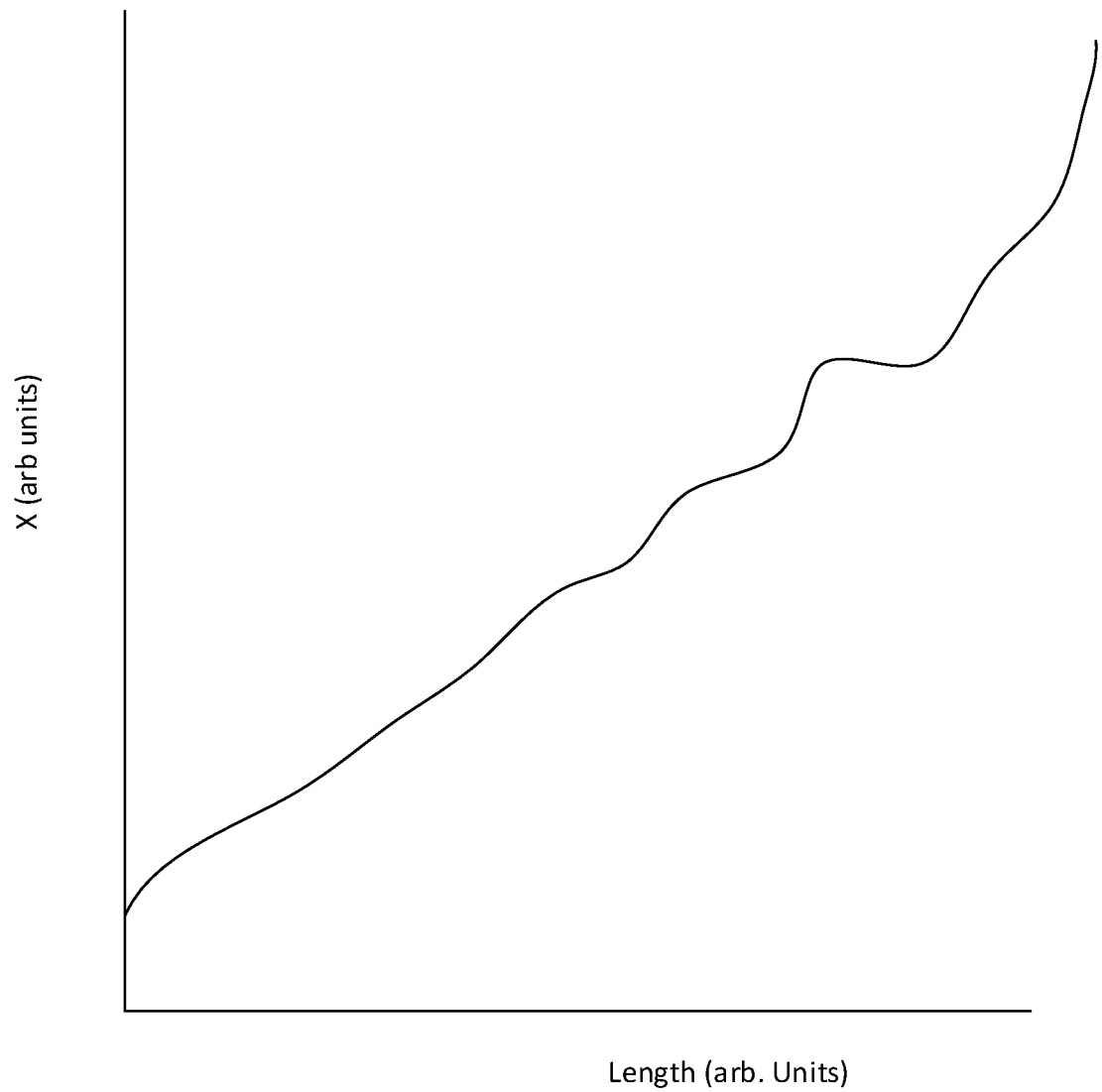
FIG. 10 is an example diagram of a value of x that is continuously varied along a length.

In yet another embodiment, each nanowire is deposited on a light emitting structure, the light emitting structure emitting light at a wavelength of less than 495 nm. FIG. 9 shows another embodiment of the light emitting device of these teachings in which a number of nanowires are deposited on a light emitting (LED) structure. In the embodiment shown in FIG. 9, deposition of the nanowires was metal catalyst assisted. Metal catalyst can range from deposited metal to metal nanoparticles. (See, for example, Blandine Alloing, Jesús Zúñiga-Pérez, Metalorganic chemical vapor deposition of GaN nanowires: From catalyst-assisted to catalyst-free growth, and from self-assembled to selective-area growth, Materials Science in Semiconductor Processing 55 (2016) 51-58, which is incorporated by reference here in in its entirety and for all purposes.) The InGaN nanowires shown in FIG. 9 were grown on blue quantum well (QW) LEDs, consisting p type doped GaN contact layer, AlGaN electro blocking layer, InGaN/GaN quantum wells, and n type doped GaN layers. The InGaN nanowires are grown using a catalyst assisted method, where metals such as Au, and Ni can be used as catalyst materials. The catalyst materials can be deposited on p-type GaN by evaporation. The growth can take place in MBE or MOCVD systems. (See, for example, W.-C. Tang, and F. C.-N. Hong, The effects of V/III gas ratios on the catalyst-assisted growths of InGaN nanowires, Applied Surface Science 354, 173-178 (2015), or T. W. George, A. A. Talin, J. W. Donald, J. R. Creighton, L. Elaine, J. A. Richard, and A. Ilke, Highly aligned, template-free growth and characterization of vertical GaN nanowires on sapphire by metal-organic chemical vapour deposition, Nanotechnology 17, 5773 (2006), which are incorporated by reference here in in their entirety and for all purposes.)

In one or more embodiments, the method of these teachings for making a phosphor component includes depositing a plurality of nanowires absorbing light at one wavelength and emitting light at a longer wavelength on a substrate, the longer wavelength being from about 495 nm to about 700 nm; each one of the plurality of nanowires being one of a nanowire described by a composition formula of $In_xGa_{1-x}N$, x being between about 0.1 to about 0.8 or a GaN nanowire having $In_xGa_{1-x}N$ discs in the nanowire structure, x being between about 0.1 to about 0.8.

In one instance, the method also includes separating each nanowire from the plurality of nanowires source such that said each nanowire from the plurality of nanowires is not on a common substrate with another nanowire from the plurality of nanowires.

The deposition method for the plurality of nanowires can be molecular beam epitaxy or low temperature halide chemical vapor deposition. In one instance, the substrate is either us silicon or silicon with a sacrificial layer. In another instance, the substrate includes a light source emitting light at a wavelength of less than 495 nm.

The separating of each nanowire can be performed by one of a number of techniques, such as razor blade cutting, ultrasonic sonication (see, for example, Magnetic Alignment of Nanowires, Chem. Mater. 2005, 17, 1320-1324, which is incorporated by reference here in in each entirety and for all purposes), or using a substrate including a sacrificial layer and removing the sacrificial layers. In one instance, razor blade cutting includes nanoskiving (sectioning) (see, for example, Darren J. Lipomi, Ramses V. Martinez, and George M. Whitesides, Use of Thin Sectioning (Nanoskiving) to Fabricate Nanostructures for Electronic and Optical Application, Angew. Chem. Int. Ed. 2011, 50, 8566-8583, which is incorporated by reference herein in its entirety and for all purposes).

Figure 8:
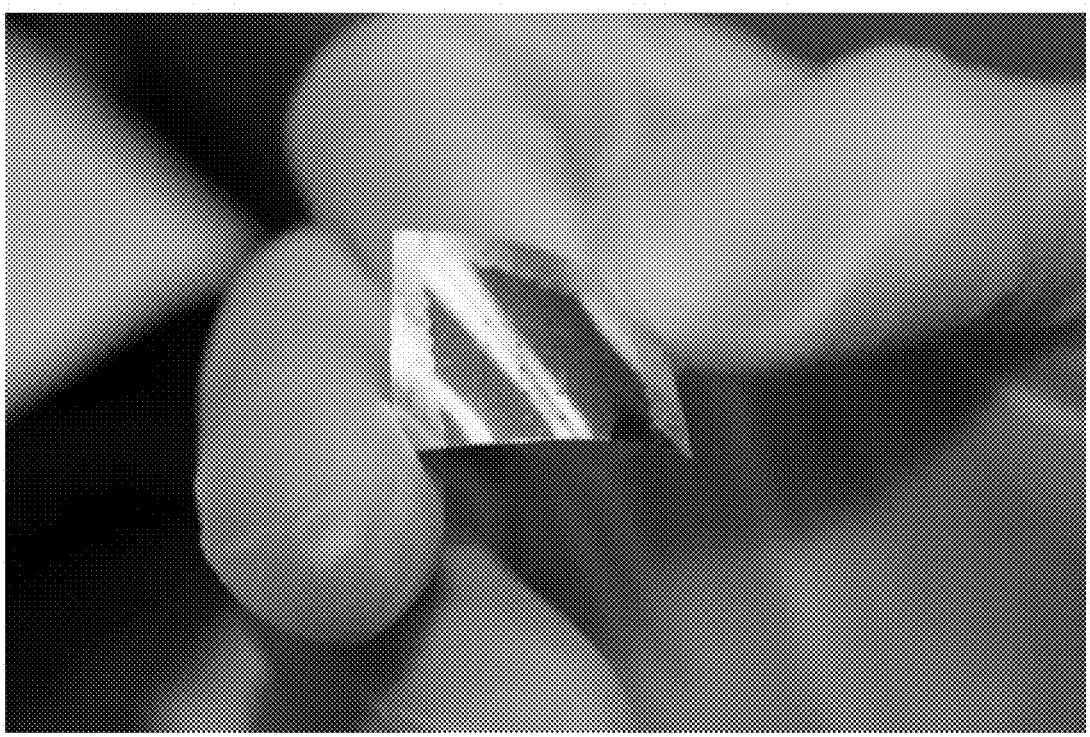
FIG. 8 shows a Micrograph image of InGaN nanowires transferred on kapton substrate.

In one embodiment, both the InGaN nanowires and InGaN quantum disk in nanowires have been removed from the Silicon substrates and transferred onto a flexible Kapton films. FIG. 8 illustrates a picture of the transferred nanowires.

In one instance, the method of these teachings includes dispersing the plurality of nanowires in a binder and disposing the plurality of nanowires dispersed in the binder to receive light from a light source emitting light at a wavelength of less than 495 nm.

Figure 6:
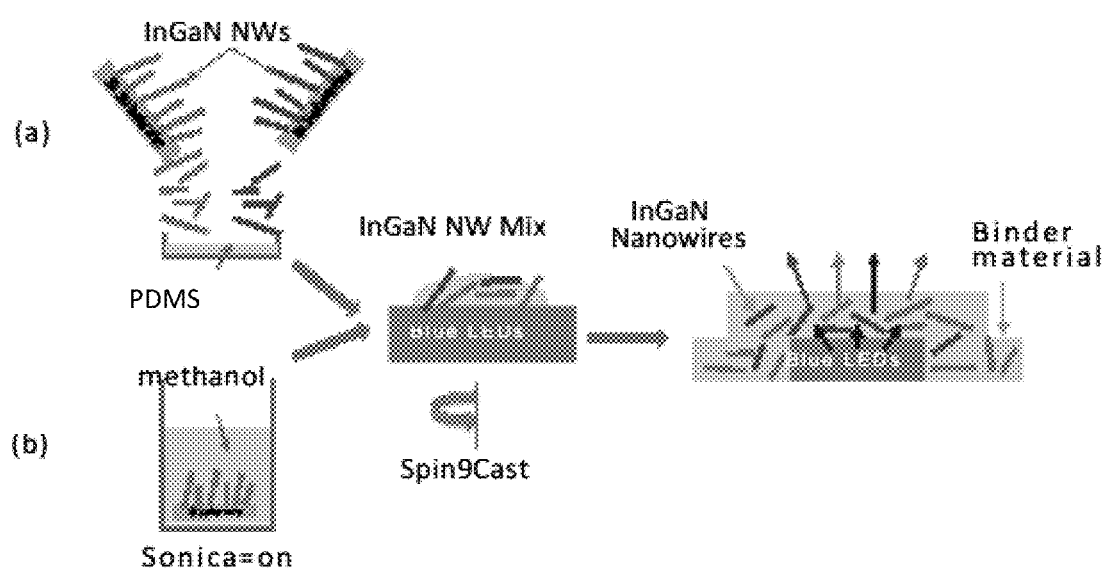
FIG. 6 shows a schematic flow chart of one embodiment of the method of these teachings.

FIG. 6 shows a schematic flow chart of one embodiment of the method of these teachings. Referring to FIG. 6, in the embodiment shown there in, the nanowires are deposited on a substrate, are separated, cleaned and dispersed in a binder and disposed to receive light from the light source emitting at a wavelength of less than 495 nm (labeled a blue LED).

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although these teachings have been described with respect to various embodiments, it should be realized these teachings are also capable of a wide variety of further and other embodiments within the spirit and scope of the appended claims.

What is claimed is:

1. A phosphor component comprising:
a plurality of nanowires configured for absorbing light at one wavelength and for emitting, in response to the absorbed light, light at wavelengths between about 495 nm and about 780 nm, each one of the plurality of nanowires being one of a nanowire described by a composition formula of $In_xGa_{1-x}N$, x being between about 0.1 to about 0.8, wherein a value of x varies continuously along a length of each nanowire.

2. The phosphor component of claim 1 wherein the plurality of nanowires comprises a first plurality of nanowires having a value of x from about 0.1 to about 0.5 and a second plurality of nanowires having the value of x from about 0.5 to about 0.6.

3. The phosphor component of claim 1 wherein each nanowire from the plurality of nanowires is not on a common substrate with another nanowire from the plurality of nanowires.

4. The phosphor component of claim 1, further comprising:
a binder including at least one of a polymer or oligomer binding agent, wherein the plurality of nanowires is disposed in the binder.

5. The phosphor component of claim 1 wherein each nanowire from the plurality of nanowires is disposed on a light emitting structure, the light emitting structure emitting light at a wavelength of less than 495 nm.

6. A light emitting device comprising:
a light source configured to emit light at a wavelength of less than 495 nm; and
a plurality of nanowires configured to absorb light emitted by the light source and to, in response to the absorbed light, emit light having wavelengths between about 495 nm and about 780 nm, each one of the plurality of nanowires being one of a nanowire described by a composition formula of $In_xGa_{1-x}N$, x being between about 0.1 to about 0.8, x being between about 0.1 to about 0.8, wherein a value of x varies continuously along a length of each nanowire.

7. The light emitting device of claim 6, wherein the plurality of nanowires comprises a first plurality of nanowires having a value of x from about 0.10 to about 0.5 and a second plurality of nanowires having the value of x from about 0.5 to about 0.6.

8. The light emitting device of claim 6 wherein each nanowire from the plurality of nanowires is not on a common substrate with another nanowire from the plurality of nanowires.

9. The light emitting device of claim 6, further comprising:
a binder including at least one of a polymer or oligomer binding agent, wherein the plurality of nanowires is disposed in the binder and the binder is configured to receive the light emitted by the light source.

10. The light emitting device of claim 6 wherein each nanowire from the plurality of nanowires is disposed on the light source.

11. The light emitting device of claim 6 wherein each nanowire from the plurality of nanowires is deposited on the light source.

12. A method for making a phosphor component, the method comprising:
depositing a plurality of nanowires configured for absorbing light at one wavelength and for emitting, in response to the absorbed light, light at wavelengths between about 495 nm and about 700 nm, each one of the plurality of nanowires being one of a nanowire described by a composition formula of $In_xGa_{1-x}N$, x being between about 0.1 to about 0.8, wherein a value of x varies continuously along a length of each nanowire;
wherein the plurality of nanowires constitutes the phosphor component.

13. The method of claim 12 further comprising:
separating each nanowire from the plurality of nanowires such that said each nanowire from the plurality of nanowires is not on a common substrate with another nanowire from the plurality of nanowires.

14. The method of claim 12 wherein the plurality of nanowires is deposited by one of molecular beam epitaxy, low temperature halide chemical vapor deposition, or metal-Organic Chemical Vapor Deposition.

15. The method of claim 13 wherein separating said each nanowire is performed by at least one of razor blade cutting, ultrasonic sonication or using a substrate including a sacrificial layer and removing the sacrificial layer.

16. The method of claim 13 further comprising:
dispersing the plurality of nanowires in a binder; and
disposing the plurality of nanowires dispersed in the binder to receive light from a light source emitting light at a wavelength of less than 495 nm.

* * * * *

UNITED STATES PATENT AND TRADEMARK OFFICE
CERTIFICATE OF CORRECTION

PATENT NO. : 11,257,984 B2
APPLICATION NO. : 16/619808
DATED : February 22, 2022
INVENTOR(S) : Guo It is certified that error appears in the above-identified patent and that said Letters Patent is hereby corrected as shown below:

On the Title Page

Column 2, item (57), under "ABSTRACT", Line 1, delete "nanow-" and insert -- nano- --, therefor.

Column 2, item (57), under "ABSTRACT", Line 2, delete "ires" and insert -- wires- --, therefor.

Column 2, item (57), under "ABSTRACT", Line 6, delete "InxGa1-$_x$N, $_x$" and insert -- In$_x$Ga$_{1-x}$N, x --, therefor.

Column 2, item (57), under "ABSTRACT", Line 7, delete "In$_x$Ga1-$_x$N" and insert -- In$_x$Ga$_{1-x}$N --, therefor.

Signed and Sealed this
Ninth Day of August, 2022

Katherine Kelly Vidal
*Director of the United States Patent and Trademark Office*